US006898748B1

United States Patent
Nakamura

(10) Patent No.: US 6,898,748 B1
(45) Date of Patent: May 24, 2005

(54) TEST CIRCUIT METHOD AND APPARATUS

(75) Inventor: Yoshiyuki Nakamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 499 days.

(21) Appl. No.: 09/688,803

(22) Filed: Oct. 17, 2000

(30) Foreign Application Priority Data

Oct. 19, 1999 (JP) .......................... 11-297453

(51) Int. Cl.[7] .......................................... G01R 31/28
(52) U.S. Cl. .................... 714/729; 714/742; 714/724
(58) Field of Search ................ 714/724, 726, 714/727, 742, 733

(56) References Cited

U.S. PATENT DOCUMENTS

| 5,627,841 A | * | 5/1997 | Nakamura ................ 714/731 |
| 5,680,406 A | * | 10/1997 | Nakamura ................ 714/724 |
| 5,710,867 A | * | 1/1998 | Giacalone et al. ............ 706/1 |
| 5,768,289 A | * | 6/1998 | James ....................... 714/727 |
| 5,847,561 A | * | 12/1998 | Whetsel .................... 324/158.1 |
| 5,960,008 A | * | 9/1999 | Osawa et al. ............... 714/726 |
| 6,000,051 A | * | 12/1999 | Nadeau-Dostie et al. ... 714/727 |
| 6,079,039 A | * | 6/2000 | Nakamura ................ 714/726 |
| 6,122,762 A | * | 9/2000 | Kim .......................... 714/726 |
| 6,134,675 A | * | 10/2000 | Raina ........................ 714/37 |
| 6,189,128 B1 | * | 2/2001 | Asaka ......................... 716/4 |
| 6,223,315 B1 | * | 4/2001 | Whetsel .................... 714/727 |
| 6,324,662 B1 | * | 11/2001 | Haroun et al. ............. 714/724 |

FOREIGN PATENT DOCUMENTS

| JP | 10-078475 | 3/1998 |
| JP | 11-202031 | 7/1999 |

* cited by examiner

Primary Examiner—Greg J Lamarre
Assistant Examiner—Mujtaba Chaudry
(74) Attorney, Agent, or Firm—Foley & Lardner LLP

(57) ABSTRACT

A test circuit for integrated circuit devices shortens test times, and reduces the length of the test pattern and the number of external terminals. The test circuit is provided between first and second target circuits, and incorporates a first selection section for selecting one of a first output signal from the first target circuit, a second output signal from the second target circuit, and a test signal indicating a test pattern input via a test pattern input terminal. A temporarily data storage section stores the signal selected by the first section, and a second selection selects one of temporarily stored data or the second output signal. The results are provide to the first target circuit. A third selecting section is provided; for selecting one of the temporarily stored data signal or the first output signal, and providing the selected signal to the second target circuit.

5 Claims, 9 Drawing Sheets

TEST CIRCUIT METHOD AND APPARATUS

BACKGROUND OF THE INVENTION

1. Field of the Invention

The present invention relates to an integrated circuit and a test circuit for testing the integrated circuit.

2. Description of the Related Art

Conventionally, in order to test a large-scale core (portion) and its peripheral circuits used in integrated circuit devices, the core is generally isolated. In this case, it is necessary to provide access paths for directly setting (or sending) and observing test data to the core and its peripheral circuits from external terminals. There are two known methods for setting the access paths: the first one is a parallel type, in which data are provided from external terminals to core terminals in a one-to-one correspondence relationship (refer to Japanese Unexamined Patent Application, First Publication, No. Hei 11-202031), and the second one is a serial type, in which data are serially sent from a single external terminal via a scan (or scanning) path (refer to Japanese Unexamined Patent Application, First Publication, No. Hei 10-78475).

The above publication Hei 10-78475 discloses a method of testing the core of a RAM (called "RAM core", hereinafter), to which the serial method is applied. In the method, each input terminal of the RAM core is connected to a scan path having three scan flip-flops (abbreviated to "input FF side", hereinafter), and similarly, each output terminal of the RAM core is connected to a scan path having three scan flip-flops (abbreviated to "output FF side", hereinafter). The input FF side, RAM core, and output FF side are serially connected. In order to test the RAM core in the above structure having a serial chain of the input FF and output FF sides, a test signal is input from the input FF side, and an output signal is output from the output FF side.

In this test circuit, the number of external terminals agrees with the number of scan flip-flops. Therefore, a clock signal must be input 6 times so as to repeat the shifting process, where the repetition number corresponds to the number of the flip-flops. In addition, wiring for making each signal pass through a logic circuit (i.e., user logic) is provided for each output terminal.

According to the above test method, a scan flip-flop is necessary for each terminal of the RAM core, and thus the clock signal must be input 6 times in a test. Therefore, if many terminals are provided for the RAM core, then the time necessary for executing the test will be long. In addition, the arrangement of the wiring may be complicated because the wiring for testing the core passes through the logic section.

The other publication, Hei 1-202031, discloses a parallel method of testing the core. In the disclosed circuit, a selector for selecting one of a test signal and an output signal from the core based on a test mode signal is connected to an output terminal of the first core, while a selector for outputting the test signal to an input terminal of the core or to an output terminal (connected to an external device) is connected to an input terminal of the second core. In this structure, value data are parallel-input from external terminals via the selector connected to the output terminal of the first core, while output data are parallel-output to external terminals via the selector connected to the second core. Therefore, it is necessary to provide external terminals, the number of which agrees with the number of terminals of all cores. In addition, the cores must be directly connected.

In the method disclosed by Hei 1-202031, the number of external terminals is not considered, and if many cores are used, the number of external terminals may be insufficient, resulting in the situation that tests cannot be executed. Additionally, in the above circuit arrangement, the wiring is complicated because each terminal of the cores needs specific wiring.

As explained above, in the conventional serial method, a long test time is necessary and the wiring is complicated, while in the conventional parallel method, the number of external terminals may be insufficient if the number of terminals of the cores is large, so that it is impossible to execute the test. Also in the conventional parallel method, the wiring arrangement is complicated because specific wiring is necessary for each terminal of the cores.

SUMMARY OF THE INVENTION

In consideration of the above circumstances, an objective of the present invention is to provide a test circuit for integrated circuit devices, which can shorten the test time, and can reduce the length of the test pattern and the number of external terminals.

Therefore, the present invention provides a test circuit as a basic unit, provided between first and second target circuits, for testing the target circuits, comprising:

a first selecting section for selecting and outputting one of a first output signal output from the first target circuit, a second output signal output from the second target circuit, and a test signal indicating a test pattern input via a test pattern input terminal, according to first and second test mode signals supplied from an external device;

a temporary data storage section for temporarily storing the signal selected by the first section as a data signal;

a second selecting section for selecting one of the temporarily stored data signal or the second output signal from the second target circuit according to the second test mode signal, and providing the selected signal to the first target circuit; and a third selecting section for selecting one of the temporarily stored data signal or the first output signal from the first target circuit according to a third test mode signal supplied from an external device, and providing the selected signal to the second target circuit, and wherein:

the temporarily stored data signal is also output as a test result via a test pattern output terminal.

Accordingly, the test circuit can be provided between first and second target circuits such as a core and a user circuit as explained later in an embodiment, and the input signals of the first and second target circuits are input into a single device and selectively stored in a common storage device. Therefore, the serial length of the test chain can be reduced, thereby reducing the test time.

The present invention also provides an integrated circuit device including a test circuit as explained above.

Typically, the first, second, and third selecting sections are multiplexers.

The present invention also provides a first system of forming test circuits for testing target circuits in an integrated circuit device, comprising:

a parallel number calculating section for calculating the number of input-output chains, each chain for inputting and outputting a test signal, based on the number of test terminals for connecting the integrated circuit device and external circuits;

a detecting section for comparing the number of input terminals and the number of output terminals of each target circuit, and determining a larger or equal number as a compared result; and a serial length calculating section for calculating a serial length for the relevant target circuit by dividing the number determined by the detecting section by the parallel number calculated by the parallel number calculating section, where the serial length indicates the number of storage elements which are serially connected, and wherein the number of input-output chains for parallel-testing each target circuit is determined based on the parallel number calculated by the parallel number calculating section, and the serial length of each input-output chain is determined based on the serial length for the relevant target circuit calculated by the serial length calculating section.

The present invention also provides a second system of forming test circuits for testing target circuits in an integrated circuit device, comprising:

a parallel number calculating section for calculating the number of input-output chains, each chain for inputting and outputting a test signal, based on the number of test terminals for connecting the integrated circuit device and external circuits;

a detecting section for comparing each number of input terminals and each number of output terminals of the target circuits, and detecting a maximum number as a compared result; and a common serial length calculating section for calculating a common serial length for all the target circuits by dividing the number determined by the detecting section by the parallel number calculated by the parallel number calculating section, where the serial length indicates the number of storage elements which are serially connected, and wherein the number of input-output chains for parallel-testing each target circuit is determined based on the parallel number calculated by the parallel number calculating section, and the serial length of each input-output chain is determined based on the common serial length calculated by the common serial length calculating section.

According to each system, the test terminals (which can be used) are optimally used in the determination of each serial input-output chain, thereby further efficiently reducing the test time. In addition, a test circuit is formed based on the test terminals which can be used; thus, an increase in the number of test terminals can be prevented.

The present invention also provides a system of forming test circuits for testing an integrated circuit device, comprising:

a test circuit forming section for forming test circuits as the above-explained basic units, where the number of the test circuits agrees with the number of pairs of input and output terminals of the first target circuit;

a core connecting section for connecting each test circuit formed by the test circuit forming section to a pair of input and output terminals of the first target circuit; and a serial-connecting section for connecting an external terminal of the integrated circuit device and the test pattern input terminal of one of the test circuits, and repeating an operation of connecting the test pattern output terminal of the connected test circuit and the test pattern input terminal of another test circuit, so as to form a serial chain of a predetermined number of the test circuits, wherein:

a test result is output from the test pattern output terminal of the last connected test circuit.

This system may further comprise:

a parallel-connecting section for providing separated serial chains, based on the number of test terminals for connecting the integrated circuit device and external circuits, and the number of the pairs of input and output terminals, and wherein a test signal is supplied to each serial chain provided by the parallel-connecting section, and a test result is output from the test pattern output terminal of the last connected test circuit of the relevant chain.

The present invention also provides an integrated circuit device including a target circuit to be tested, comprising:

test circuits as the above-explained basic units, where the number of the test circuits agrees with the number of pairs of input and output terminals of the first target circuit, wherein:

each test circuit is connected to a pair of input and output terminals of the first target circuit, an external terminal of the integrated circuit device is connected to the test pattern input terminal of one of the test circuits, a serial chain of a predetermined number of the test circuits is formed by connecting an external terminal of the integrated circuit device and the test pattern input terminal of one of the test circuits, and repeating an operation of connecting the test pattern output terminal of the connected test circuit and the test pattern input terminal of another test circuit, and the test pattern output terminal of the last connected test circuit is connected to another external terminal of the integrated circuit device for outputting a test result.

The present invention also provides a test method of testing first and second target circuits, comprising the steps of:

selecting and outputting one of a first output signal output from the first target circuit, a second output signal output from the second target circuit, and a test signal indicating a test pattern input via a test pattern input terminal, according to first and second test mode signals supplied from an external device;

temporarily storing the selected signal as a data signal; selecting one of the temporarily stored data signal or the second output signal from the second target circuit according to the second test mode signal, and providing the selected signal to the first target circuit;

selecting one of the temporarily stored data signal or the first output signal from the first target circuit according to a third test mode signal supplied from an external device, and providing the selected signal to the second target circuit; and outputting the temporarily stored data signal as a test result via a test pattern output terminal.

The present invention also provides a first method of forming test circuits for testing target circuits in an integrated circuit device, comprising:

a parallel number calculating step of calculating the number of input-output chains, each chain for inputting and outputting a test signal, based on the number of test terminals for connecting the integrated circuit device and external circuits;

a detecting step of comparing the number of input terminals and the number of output terminals of each target circuit, and determining a larger or equal number as a compared result;

a serial length calculating step of calculating a serial length for the relevant target circuit by dividing the number determined in the detecting step by the parallel number calculated in the parallel number calculating step, where the serial length indicates the number of storage elements which are serially connected; and a test chain determination step of determining the number of input-output chains for parallel-testing each target circuit based on the parallel number calculated in the parallel number calculating step, and determining the serial length of each input-output chain based on the serial length for the relevant target circuit calculated in the serial length calculating step.

The present invention also provides a second method of forming test circuits for testing target circuits in an integrated circuit device, comprising:

a parallel number calculating step of calculating the number of input-output chains, each chain for inputting and outputting a test signal, based on the number of test terminals for connecting the integrated circuit device and external circuits;

a detecting step of comparing each number of input terminals and each number of output terminals of the target circuits, and detecting a maximum number as a compared result;

a common serial length calculating step of calculating a common serial length for all the target circuits by dividing the number determined in the detecting step by the parallel number calculated in the parallel number calculating step, where the serial length indicates the number of storage elements which are serially connected; and a test chain determination step of determining the number of input-output chains for parallel-testing each target circuit based on the parallel number calculated in the parallel number calculating step, and determining the serial length of each input-output chain based on the common serial length calculated in the common serial length calculating step.

The present invention also provides a computer readable storage medium storing a program for making a computer execute an operation by any one of the above-explained methods.

DESCRIPTION OF THE PREFERRED EMBODIMENTS

Hereinafter, embodiments according to the present invention will be explained with reference to the drawings.

Figure 1:
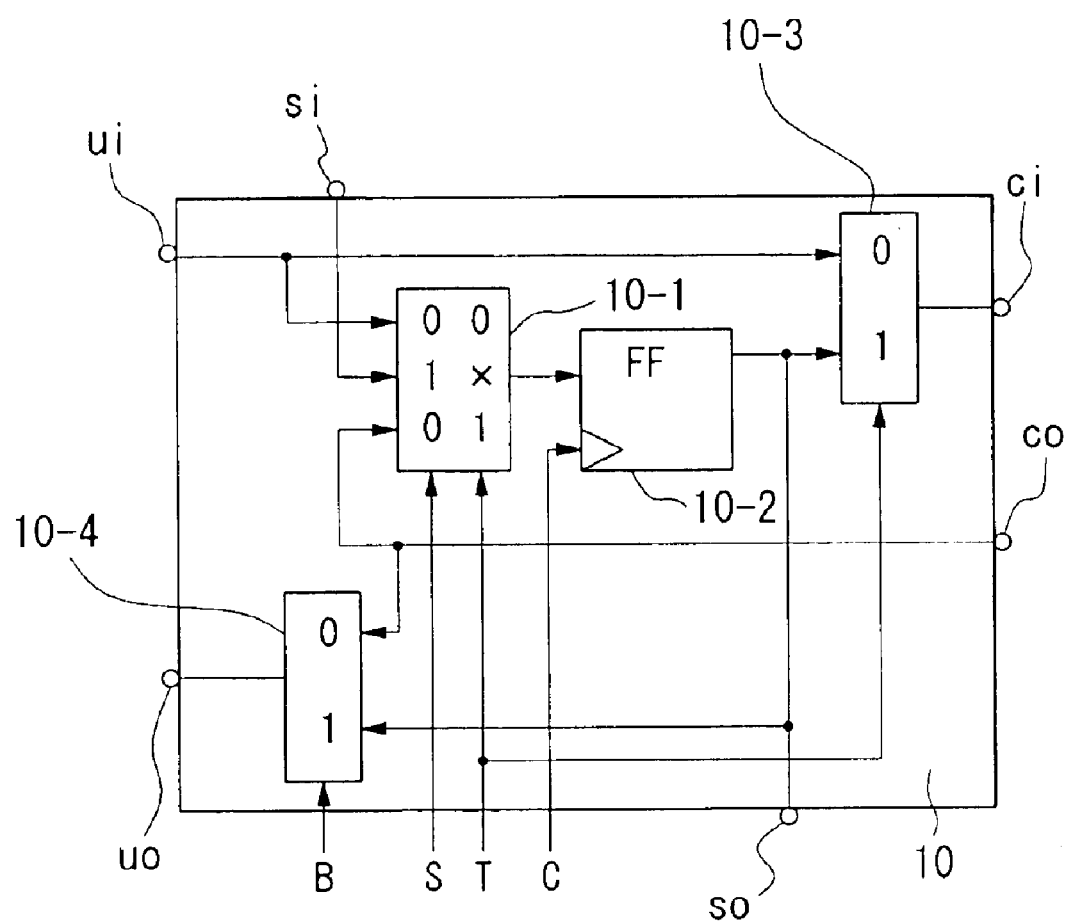
FIG. 1 is a block diagram showing the general structure of test circuit 10 as an embodiment according to the present invention.

FIG. 1 is a block diagram showing the general structure of test circuit 10 (corresponding to the test circuit according to the present invention) as an embodiment of the present invention. In the figure, multiplexer (abbreviated to "MUX", hereinafter) 10-1 selects (i) a signal input from terminal "ui" when a test mode signal S, input from an external device, is (or indicates) 0, and a test mode signal T, also input from an external device, is also 0, (ii) a signal input from terminal "co" when the test mode signal is 0 while the test mode signal T is 1, or (iii) a signal from a test pattern input terminal "si" when the test mode signal S is 1. That is, according to the states of the test mode signals, the MUX 10-1 outputs a selected signal to a flip-flop (abbreviated to "FF", hereinafter) 10-2.

According to the input timing of the clock signal C, the FF 10-2 temporarily stores a data signal input from MUX 10-1, and then outputs the signal to MUX 10-3 and MUX 10-4. The FF 10-2 also outputs the signal as a signal SO via a test pattern output terminal "so" to the outside of the test circuit 10.

The MUX 10-3 selects (i) a signal input from terminal "ui" when the test mode signal T is 0, or (ii) a signal output from FF 10-2 when the test mode signal T is 1. The MUX 10-3 outputs the selected signal via terminal "ci".

The MUX 10-4 selects (i) a signal input from terminal "co" when a signal B is 0, or (ii) a signal output from FF 10-2 when the signal B is 1. The MUX 10-4 outputs the selected signal as signal UO via terminal "uo".

Below, the method of testing an integrated circuit using the above-explained test circuit 10 will be explained.

Figure 2:
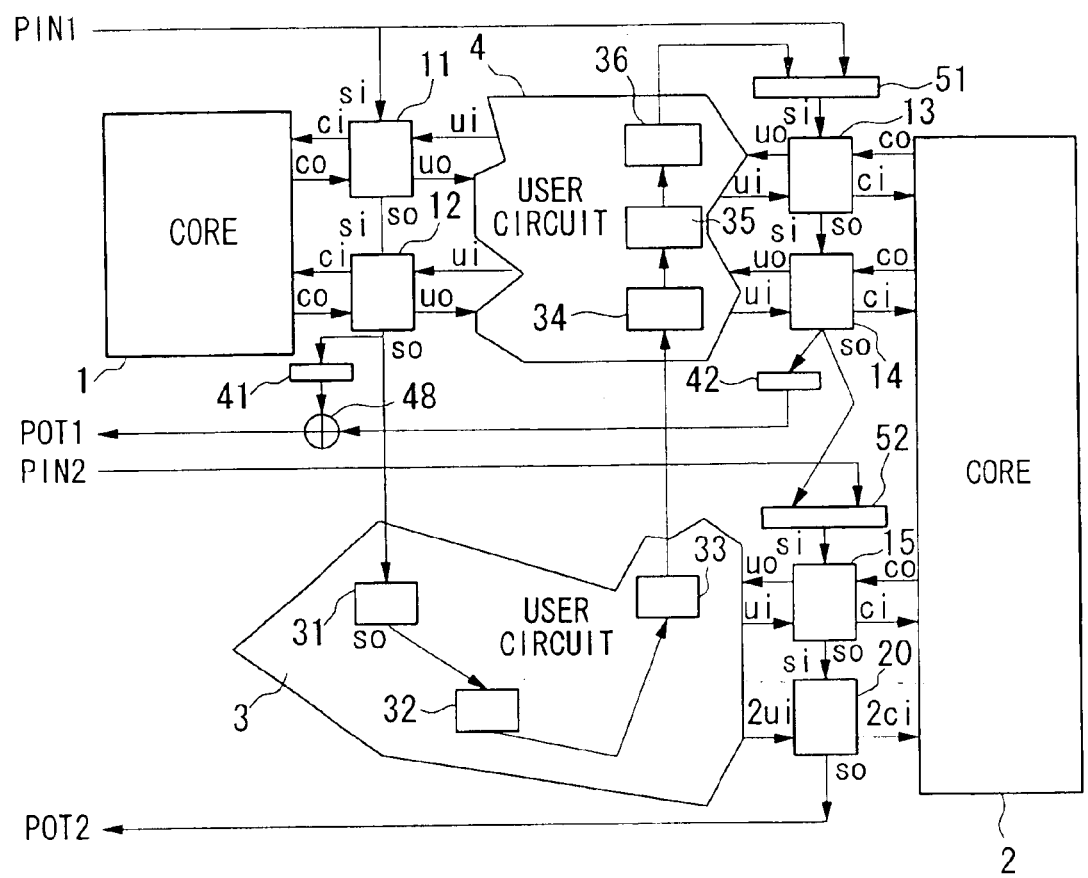
FIG. 2 is a block diagram showing the general structure of an integrated circuit which the test circuit 10 is applied.

FIG. 2 is a block diagram showing the general structure of an integrated circuit to which the test circuit 10 is applied. In the figure, (the structure of) test circuit 10 is applied to each of test circuits 11 to 15, and these test circuits are dispersed in the integrated circuit.

Reference numerals 1 and 2 indicate target cores to be tested (each corresponding to the first target circuit according to the present invention). Here, each core is a circuit which is designed in advance, for example, a CPU, RAM, or the like. Core 1 has two sets of input and output terminals. The first input terminal is connected to terminal "ci" of test circuit 11, while the first output terminal is connected to terminal "co" of test circuit 11. Similarly, the second input terminal and second output terminal of core 1 are respectively connected to terminals "ci" and "co" of circuit 12.

Core 2 has first to fourth input terminals and first to third output terminals. Similar to the case of the core 1, the first to third input terminals and the first to third output terminals are connected to corresponding terminals "ci" and "co" the test circuits 13 to 15. The fourth input terminal is connected to terminal "2ci" of circuit 20 which is explained later.

Figure 3:
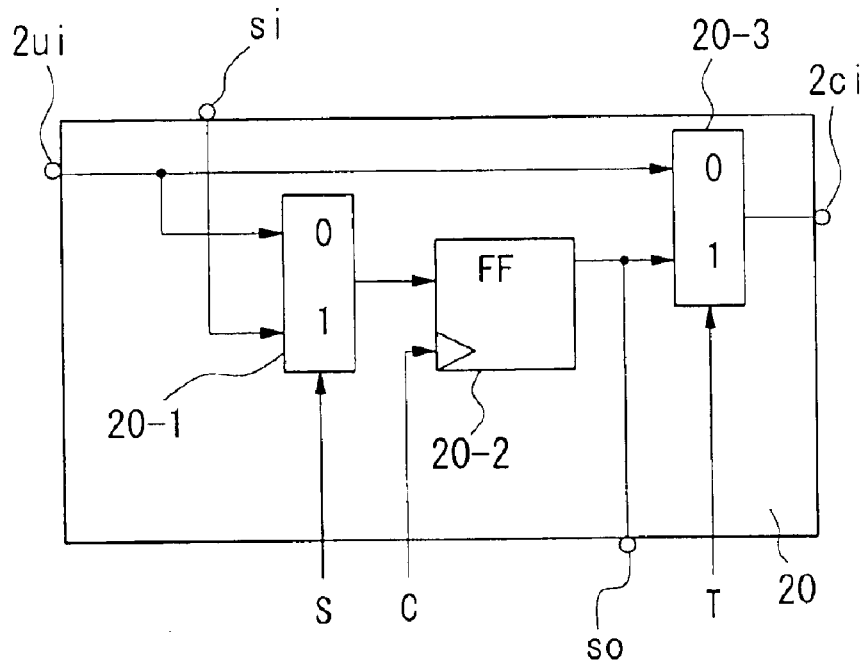
FIG. 3 is a block diagram showing the structure of circuit 20.

Below, the structure of the circuit 20 will be explained using FIG. 3. In the figure, MUX 20-1 selects (i) a signal UI input from terminal "ui" when the input test mode signal S is 0, or (ii) a signal S1 input from test pattern input terminal "si" when the test mode signal S is 1. The MUX 20-1 outputs the selected signal to FF 20-2.

According to the input timing of the clock signal C, the FF 20-2 temporarily stores the data signal input from MUX 20-1, and then outputs the signal to (i) MUX 20-3, and (ii) the outside of circuit 20 via test pattern output terminal "so" as signal SO.

The MUX 20-3 selects (i) a signal UI input from terminal "2ui" when the test mode signal T is 0, or (ii) an output from the FF 20-2 when the test mode signal T is 1. The MUX 20-1 outputs the selected signal as signal CI via terminal "2ci" to the core 2.

In FIG. 2, reference numerals 3 and 4 indicate user circuits which are actually tested (each corresponding to the second target circuit according to the present invention). Each user circuit is, for example, a circuit for connecting cores, a circuit for an additional custom-made function, or the like.

The input terminal of user circuit 3 is connected to the test pattern output terminal "so" of test circuit 12, while the output terminal of the circuit 3 is connected to the input terminal of user circuit 4. The user circuit 4 has the first to fourth input terminals and the first to fourth output terminals. The first input terminal is connected to terminal "uo" of test circuit 11, while the first output terminal is connected to terminal "ui" of the test circuit 11. The second input terminal and the second output terminal are respectively connected to terminals "uo" and "ui" of test circuit 12. The third input terminal and the third output terminal are respectively connected to terminals "uo" and "ui" of test circuit 14. The fourth input terminal and the fourth output terminal are respectively connected to terminals "uo" and "ui" of test circuit 13.

Figure 4:
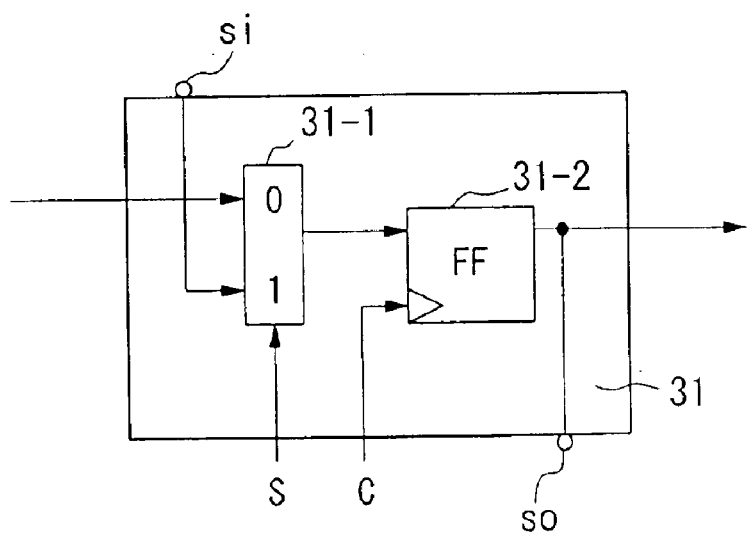
FIG. 4 is a block diagram showing the structure of a scan flip-flop (scan FF).

Below, the structure of a scan FF 31 will be explained with reference to FIG. 4. In the figure, MUX 31-1 selects (i) a signal S1 input from test pattern input terminal "si" when the test mode signal S is 1, or (ii) a signal input from a user circuit when the test mode signal S is 0. The MUX 31-1 outputs the selected signal to FF 31-2.

According to the input timing of the clock signal C, the FF 31-2 temporarily stores a data signal input from the MUX 31-1, and then outputs the signal to (i) a user circuit, and (ii) the outside of the scan FF 31 as signal SO via the test pattern output terminal "so". The clock signal C supplied to the test circuit 10, circuit 20, and scan FF 31 is a single-phase signal, but is not limited to that. For example, a multi-phase signal may be used.

In FIG. 2, scan FFs 32 to 36 have the same structure as that of the scan FF 31. The scan FFs 31 to 33 are provided inside the user circuit 3, while the scan FFs 34 to 36 are provided inside the user circuit 4.

The test pattern input terminal "si" of scan FF 31 is connected to the test pattern output terminal "so" of test circuit 12, while the test pattern output terminal "so" of the scan FF 31 is connected to the test pattern input terminal "si" of scan FF 32. The test pattern input terminal "si" and test pattern output terminal "so" of each of the following scan FFs 32 to 36 are serially connected (see FIG. 2). The test pattern output terminal "so" of scan FF 36 is connected to the input of selector 51.

Figure 5:
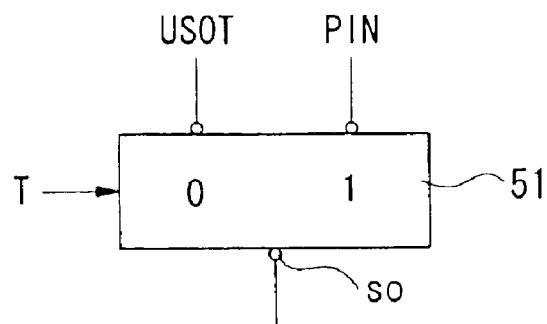
FIG. 5 is a diagram showing the structure of selector 51.

Below, the structure of the selector 51 will be explained with reference to FIG. 5.

The selector 51 selects (i) a signal SO output from scan FF 36 when the test mode signal T is 0, or (ii) a test signal indicating a test pattern input from the parallel test terminal PIN1, which is an external terminal of the present integrated circuit, when the test mode signal T is 1. The selector 51 outputs the selected signal via test pattern output terminal "so".

The selector 52 selects (i) a signal SO output from test circuit 14 when the test mode signal T is 0, or (ii) a test signal indicating a test pattern input from the parallel test terminal PIN2 of the integrated circuit, when the test mode signal T is 1. The selector 52 outputs the selected signal via test pattern output terminal "so" to parallel test terminal POT2 of the integrated circuit (see FIG. 2).

Figure 6:
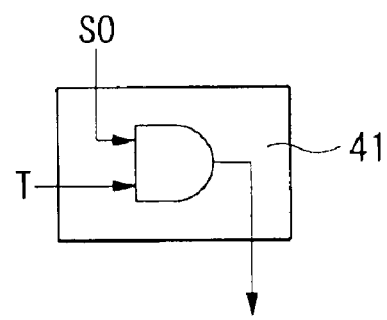
FIG. 6 is a diagram showing the structure of circuit 41.

Next, the circuit 41 will be explained with reference to FIG. 6. The circuit 41 is formed using an AND circuit, into which the test mode signal T and the test pattern signal SO output from the test circuit 12 are input, and from which an output signal is output to an OR circuit 48. Similar to the circuit 41, the circuit 42 is formed using an AND circuit, into which the test mode signal T and the test pattern signal SO output from the test circuit 14 are input, and from which an output signal is output to an OR circuit 48. The OR circuit 48 executes OR operation between signals output from the circuits 41 and 42, and outputs the result of the operation via output terminal POT1 to the outside of the integrated circuit.

Figure 7:
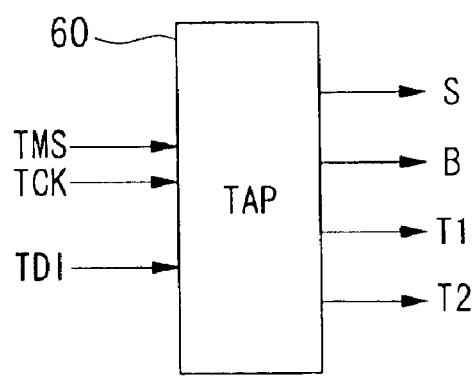
FIG. 7 is a diagram showing the structure of TAP 60.

TAP 60 shown in FIG. 7 is a device for controlling and outputting test mode signals S, B, T1, and T2 according to the states of signals TMS, TCK, and TDI which are input from an external device.

The test mode signal S is output to test circuits 11 to 15, circuit 20, and scan FFs 31 to 36. The test mode signal B is output to test circuits 11 to 15. The test mode signal T1 is output to test circuits 11 and 12, and circuit 41 as test mode signal T. The test mode signal T2 is output to test circuits 13 to 15, circuits 20 and 42, and selectors 51 and 52 as test mode signal T. Each test mode signal can be supplied using a TAP defined in, for example, IEEE 1149.1.

The operation of the test circuit having the above-explained structure will be explained.

First, the operation of testing core 1 will be explained. If TAP 60 outputs test mode signals B=1, T1=1, and T2=0 to the relevant sections, then (i) the circuit 42, receiving test mode signal T2=0, outputs 0 and (ii) the circuit 41, receiving test mode signal T1=1, outputs a signal according to the signal output from the test circuit 12, via the OR circuit 48 to terminal POT1. Accordingly, the signal output from the circuit 41 can be observed via the parallel test terminal POT1.

Next, if TAP 60 outputs test mode signal S=1, then in the test circuits 11 and 12, signal S1 is input via MUX 10-1 into FF 10-2, and the output from the FF 10-2 is output as signal SO. Accordingly, an input pattern can be serially transmitted from the parallel test terminal PIN1 to the test circuit 11, test circuit 12, and circuit 41. Simultaneously, in the test circuit 11 and 12, the output signal from FF 10-2 is also output via MUX 10-3 to core 1, thereby providing the test signal to the core 1.

Next, if TAP 60 outputs test mode signal S=0, then in the test circuits 11 and 12, signal CO output from core 1 is input via MUX 10-1 to FF 10-2. After that, when TAP 60 outputs test mode signals S=1 again, the test pattern can be serially output via parallel test terminal POT1.

Below, the operation of testing core 2 will be explained. If TAP 60 outputs test mode signals B=1, T1=0, and T2=1 to the relevant sections, then (i) the circuit 41, receiving test mode signal T1=0, outputs 0, and (ii) the circuit 42, receiving test mode signal T2=1, outputs a signal according to the signal output from the test circuit 14, via the OR circuit 48 to parallel test terminal POT1. Accordingly, the signal output from the circuit 42 can be observed via the parallel test terminal POT1.

Next, when the test mode signal T2 becomes 0, the circuit 51 selects the signal input via PIN 1 while circuit 52 selects the signal input via PIN2. Accordingly, a test pattern can be supplied to the circuits 13 and 14 from PIN1, while a test pattern can be supplied to the circuits 15 and 20 from PIN2.

Next, when the test mode signal S is set to 1, then FF 10-2 and terminal "ci" of test circuits 13 to 15 become active, and FF 20-2 and terminal "2ci" of circuits 20 also become active, so that a test pattern can be supplied to core 2. Accordingly, serial test patterns can be provided in parallel from parallel terminals PIN1 and PIN2.

Next, when the test mode signal S is set to 0, then terminal "co" and FF 10-2 of test circuits 13 to 15 become active, so that the output signal from core 2 is supplied to FF 10-2. In the circuit 20, terminal "2ui" and FF 20-2 also become active. Here, if the test mode signal S is set to 1 again, then the test patterns can be extracted in parallel from parallel test terminals POT1 and POT2.

Below, the operation of testing the user circuits will be explained.

First, the following setting is performed: test mode signal B=1, test mode signal T1=0, and test mode signal T2=0. Accordingly, the circuit 51 selects the output from scan FF 36, and circuit 52 selects the output from test circuit 14, so that a scan chain is established from parallel test terminal PIN1 to parallel test terminal POT2.

Next, when the test mode signal S is set to 1, then test pattern input terminal "si", FF 10-2, and test pattern output terminal "so" become active in the test circuits 11 to 15, and in circuit 20, test pattern input terminal "si", FF 20-2, and test pattern output terminal "so" become active, so that a serial input pattern can be provided via the parallel test terminal PIN1. Here, FF 10-2 and terminal "uo" in the test circuits 11 to 15 also become active, so that output signals can be supplied to the user circuits 3 and 4.

Simultaneously, a value (signal) is provided from test circuit 12 to scan FFs 31 to 36. Next, when the test mode signal S is set to 0, terminal "ui" and FF 10-2 become active in the test circuits 11 to 15, and terminal "ui" and FF 20-2 become active in the test circuit 20, so that outputs from the user circuits 3 and 4 are provided to each FF 10-2 and FF 20-2. In addition, value data are also supplied to scan FFs 31 to 36. When the test mode signal S is set to 1 again, the test pattern can be extracted from the parallel test terminal POT2.

Figure 8:
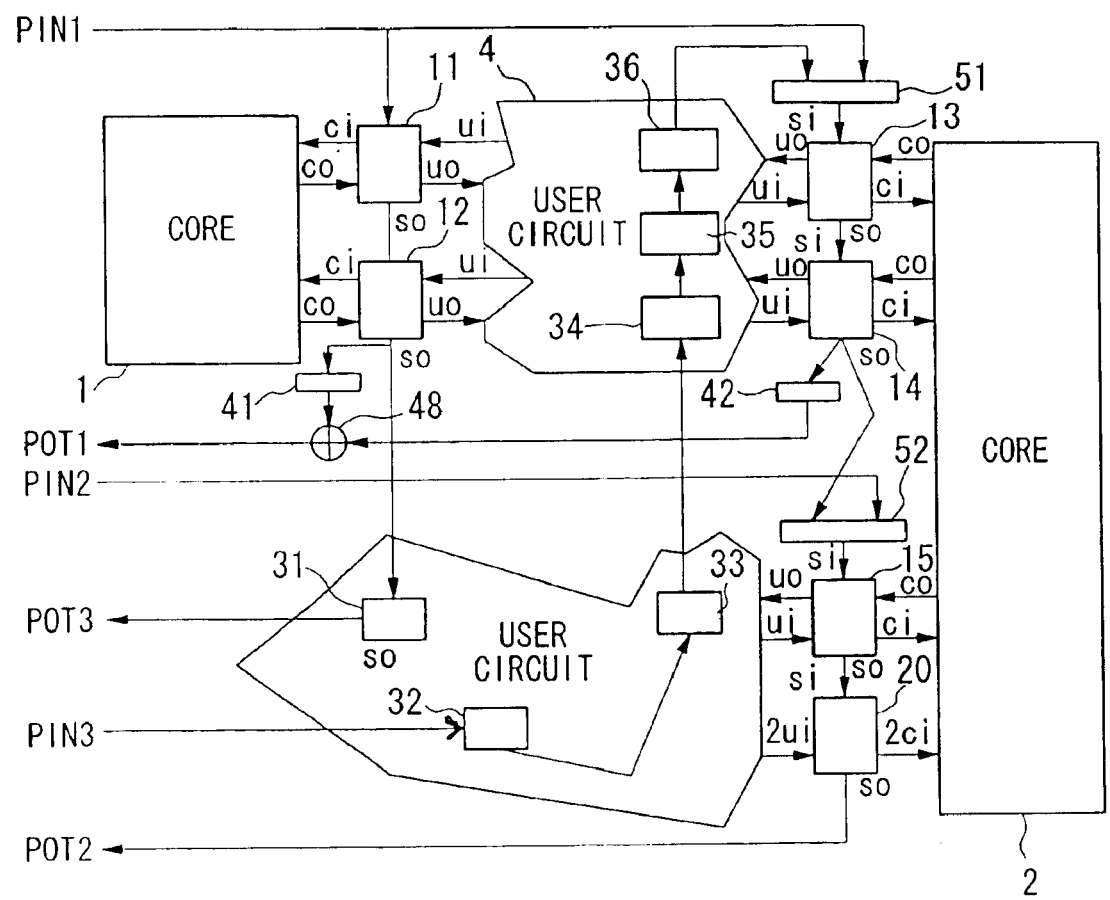
FIG. 8 is a block diagram showing the general structure of another integrated circuit to which the test circuit 10 is applied, where two serial chains are provided for testing user circuits.

In the present embodiment, only one serial chain is established in the test of the user circuits. However, similar to the operation of testing the core, a plurality of connection chains may be established (refer to FIG. 8). The structure shown in FIG. 8 has additional parallel test terminals POT3 and PIN3, and the output signal from scan FF 31 is extracted from parallel test terminal POT3, and a test pattern is input via parallel test terminal PIN3 to scan FF 32. Accordingly, two separate serial chains of (i) parallel test terminal PIN1 to POT3 and (ii) parallel test terminal PIN3 to POT2 can be established, thereby reducing the test time.

Common arrangement of the serial chains may be employed in the test of the core and the user circuit. However, in the test of the user circuits, all of the test circuits 11 to 15, circuit 20, and scan FFs 31 to 36 operate; thus, the serial chain arrangement suitable for testing the cores may not suit the user circuits. Therefore, in the present embodiment, the serial chain arrangement in the test of the user circuits differs from that for the test of the cores.

Figure 9:
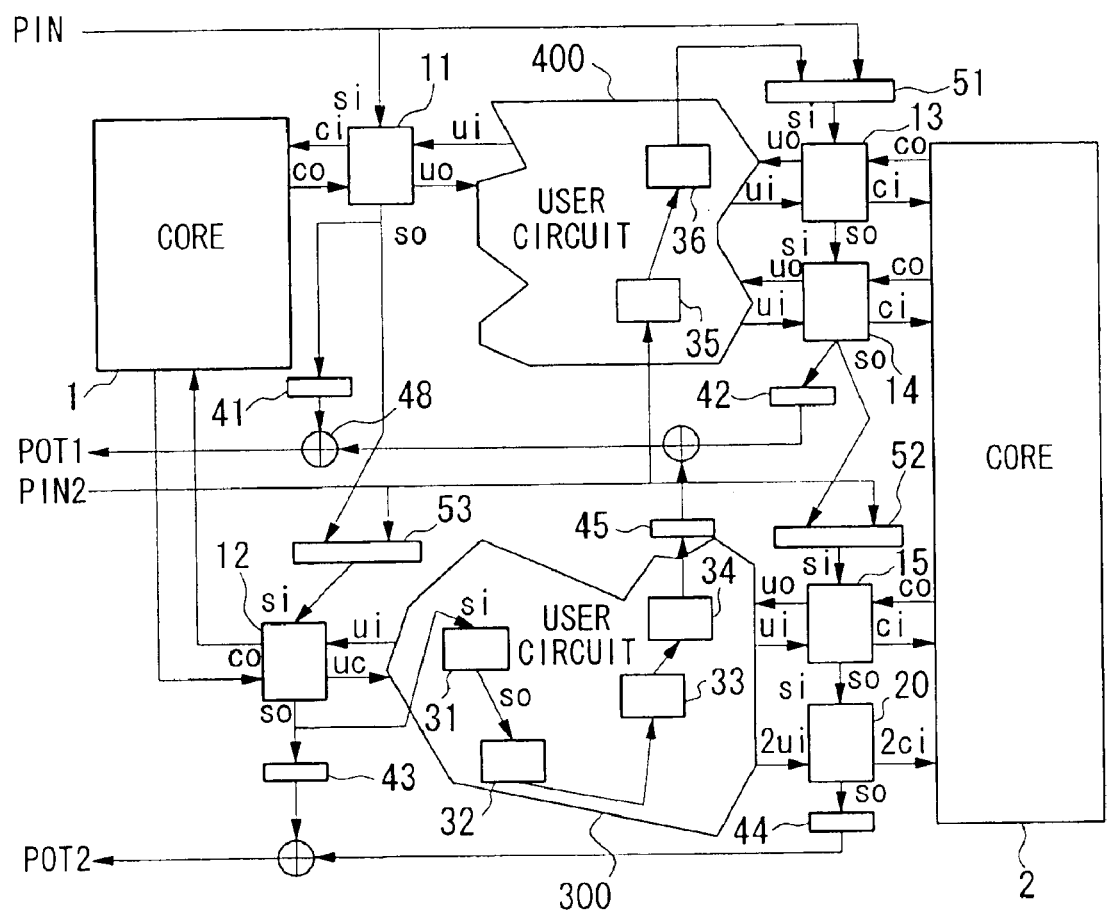
FIG. 9 is a block diagram showing the general structure of another integrated circuit to which the test circuit 10 is applied, where core 1, core 2, and their peripheral user circuits are separately tested.

FIG. 9 is a circuit diagram for explaining the second embodiment, in which core 1, core 2, and their peripheral user circuits are separately tested. The distinctive feature of the second embodiment in comparison with the first embodiment is to provide two serial chains for testing the cores and user circuits. The following are explanations of how to test core 1, core 2, and user circuits.

Figure 10:
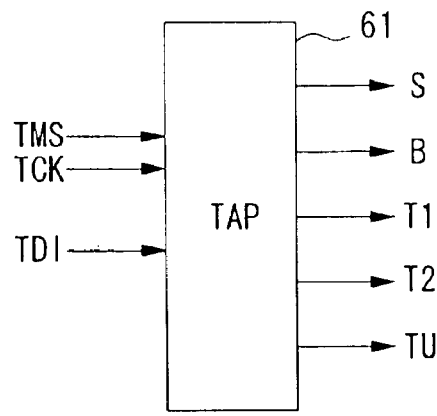
FIG. 10 is a diagram showing the structure of TAP 61.

First, TAP 61 used in the second embodiment is shown in FIG. 10. In the figure, TAP 61 controls and outputs test mode signals S, B, T1, T2, and TU according to signals TMS, TCK, and TDI which are input from an external device.

Similar to TAP 60, the test mode signals S and B are output to each relevant section. The test mode signal T1 is output as test mode signal T to test circuits 11 and 12, circuits 41 and 43, and selector 53. The test mode signal T2 is output as test mode signal T to test circuits 13 to 15, circuits 20, 42, and 44, and selectors 51 and 52. The test mode signal TU is output to circuit 45.

First, if the following signals are set and output as follows: test mode signal B=1, test mode signal T1=1, test mode signal T2=0, and test mode signal TU=0, then the outputs from the circuits 42, 45, and 44 become 0, so that the output from circuit 41 can be observed via the parallel test terminal POT1, while the output from circuit 43 can be observed via the parallel test terminal POT2.

Next, when the test mode signal S is set to 1, test pattern input terminal "si", FF 10-2, and test pattern output terminal "so" become active in the circuits 11 and 12, so that test patterns can be provided from terminals PIN 1 and PIN2. Additionally, FF 10-2 and terminal "ci" also become active, so that an input pattern can be provided to the core 1.

Next, when the test mode signal S is set to 0, terminal "co" and FF 10-2 become active in the circuits 11 and 12, so that the output from the core 1 is supplied to FF 10-2. Under this situation, when the test mode signal S is set to 1 again, it is possible to extract the relevant test patterns from the parallel test terminals POT1 and POT2.

The method of testing the core 2 will be explained below. If the following setting is provided and each test mode signal is output: test mode signal B=1, test mode signal T1=0, test mode signal T2=1, and test mode signal TU=0, then the outputs from circuits 41, 43, and 45 become 0, so that the output from circuit 42 can be observed via parallel test terminal POT1 while the output from circuit 44 can be observed via parallel test terminal POT2. The following processes in the test are similar to those in the first embodiment.

Below, the method of testing the user circuits will be explained. If the following setting is provided and each test mode signal is output: test mode signal B=1, test mode signal T1=0, test mode signal T2=0, and test mode signal TU=1, then the selector 51 selects the output from scan FF 36, selector 52 selects the output from test circuit 14, and selector 53 selects the output from test circuit 11. Accordingly, the following two scan chains are established: (i) the first chain includes parallel test terminal PIN1, test circuit 11, test circuit 12, scan FF 31, scan FF 32, scan FF 33, scan FF 34, and parallel test terminal POT1, and (ii) the second chain includes parallel test terminal PIN2, scan FF 35, scan FF 36, test circuit 13, test circuit 14, test circuit 15, circuit 20, and parallel test terminal POT2.

Under this situation, if the test mode signal S is set to 1, then in the test circuits 11 to 15, test pattern input terminal "si", FF 10-2, and test pattern output terminal "so" become active, while in the circuit 20, test pattern input terminal "si", FF 20-2, and test pattern output terminal "so" become active. Accordingly, serial test patterns can be provided from parallel test terminals PIN1 and PIN2 in parallel.

In this process, in the test circuits 11 to 15, FF 10-2 and terminal "uo" also become active, so that output signals can be provided to the user circuits 300 and 400. Also in the scan FFs 31 to 36, data are suitably set to FF 31-2.

Next, when the test mode signal S is set to 0, terminal "ui" and FF 10-2 become active in the test circuits 11 to 15, and in the circuit 20, terminal "2ui" and FF 20-2 become active. Accordingly, the outputs from the user circuits 300 and 400 are input into each of FF 10-2 and FF 20-2. Data are also provided to scan FFs 31 to 36.

Next, when the test mode signal S is set to 1 again, the relevant serial test patterns can be extracted in parallel from the parallel test terminals POT1 and POT2.

In the above-explained embodiment, each of the test circuits 11 to 15 is connected to a core and a user circuit; however, the test circuit may be provided between two cores.

Figure 11:
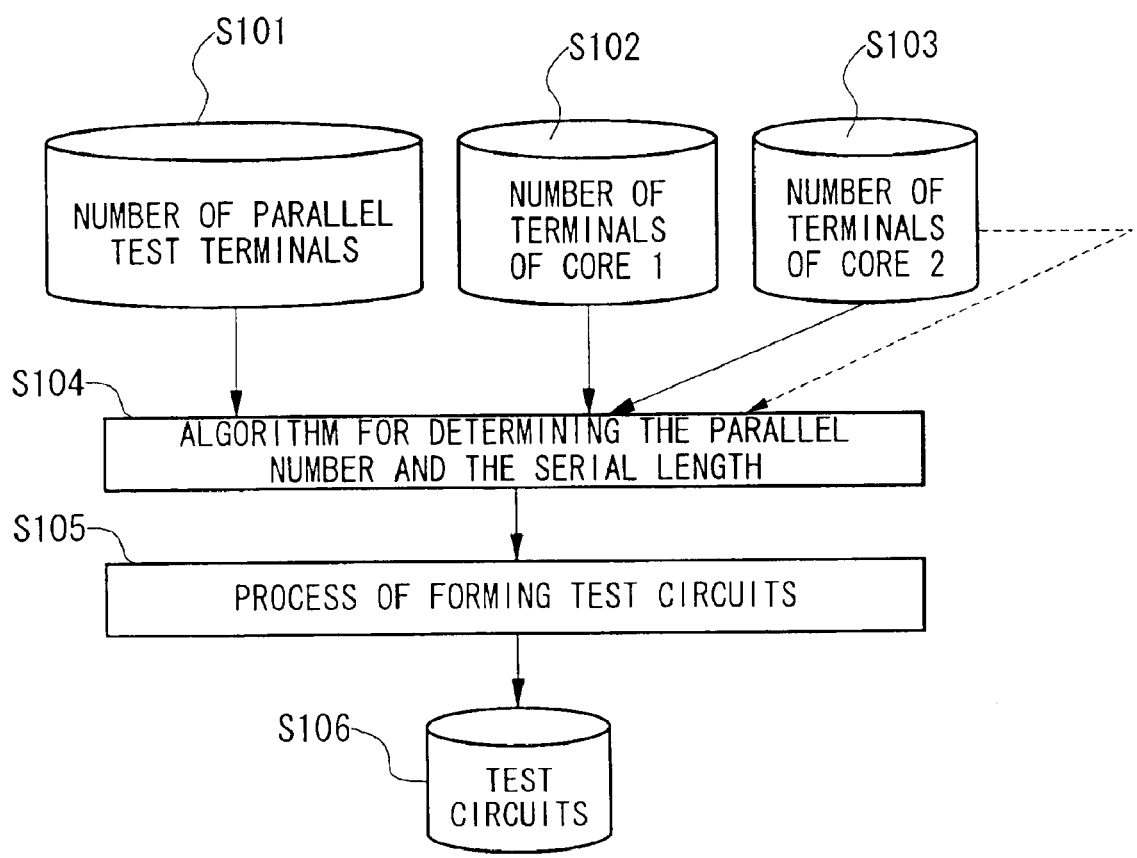
FIG. 11 is a diagram for explaining the general method of forming test circuits as an embodiment according to the present invention.

Below, an embodiment of the method of forming test circuits according to the present invention will be explained with reference to the drawings. FIG. 11 is a diagram for explaining the general method of forming test circuits in the embodiment. In this embodiment, the number of parallel test terminals is 4, the number of input terminals of core 1 is 2, the number of output terminals of core 1 is 2, the number of input terminals of core 2 is 4, the number of output terminals of core 2 is 3, and two user circuits are provided.

The number of parallel test terminals corresponds to the number of external terminals which can be used for tests among all terminals included in the integrated circuit. Here, whether each terminal can be used for testing is determined based on specific conditions such as the operation speed of the circuit connected to the terminal, whether a special interface is used, and the like (see step S101).

Next, the number of terminals of each core to be tested is detected. In the resent embodiment, "4", the number of terminals of core 1, and "7", the number of terminals of core 2, are determined and stored (see steps S102 and S103).

Next, the serial length and the number of parallel sets (called "parallel number", hereinbelow) are determined (see step S104). Here, the serial length indicates the total number of FFs 10-2 and FFs 20-2 which are serially connected with a pair of input and output parallel test terminals, while the parallel number indicates the number of pairs of the input and output terminals of the parallel test terminals, and this number can be calculated by dividing the number of parallel test terminals by 2. In the present case, the parallel number is 2.

There are two methods of calculating the serial length.

In the first method, a common serial length is calculated based on a core which has the maximum number of terminals. For example, in the first embodiment, the serial length is determined based on core 2 which has in total 7 input and output terminals. In this case, the number of input terminals of core 2 is 4, while the number of output terminals of core 2 is 3; thus, the number of input terminals (here, 4) is divided by the above-described the parallel number (here, 2), thereby calculating the common serial length (here, 2).

Here, the number of input-output (i.e., serial) chains for parallel-testing each core is determined based on the parallel number, and the serial length of each input-output chain is determined based on the common serial length.

In the second method, the serial length is determined based on the number of terminals of each core. For example, as shown in the above second embodiment, the serial length is determined based on the number of terminals of each of cores 1 and 2. In this case, the number of input terminals of core 1 is 2, and the number of output terminals of core 1 is 2; thus, 2, the number of input terminals, is divided by 2, the above parallel number, thereby the number of serial length with respect to core 1 is determined as 1. For core 2, the number of input terminals of core 1 is 4, and the number of output terminals of core 1 is 3; thus, 4, the number of input terminals, is divided by 2, the above parallel number, thereby the number of serial length with respect to core 2 is determined as 2.

Here, the number of input-output chains for parallel-testing each core is determined based on the parallel number, and the serial length of each input-output chain is determined based on the serial length for the relevant core.

Below, in the test circuit forming method, the method determining the serial length (called "user scan serial length") and the parallel number (called "user scan parallel number") with respect to scan FFs 31 to 36 will be explained. First the user scan parallel number is determined by dividing the number of parallel test terminals (here, 2) by 2; thus, 1 is the user scan parallel number. The user scan serial length is determined in a manner such that: the number of input terminals and the number of output terminals of core 1 are 2; thus, the number of terminals is 2, while the number of terminals of core 2 is 4 which is the number of the input terminals. The number of scan FFs in the user circuits is 6; thus, these numerals 2, 4, and 6 are added and the result is 12, which is then divided by 1, the user scan parallel number, so that the user scan serial length is determined as 12.

Figure 12:
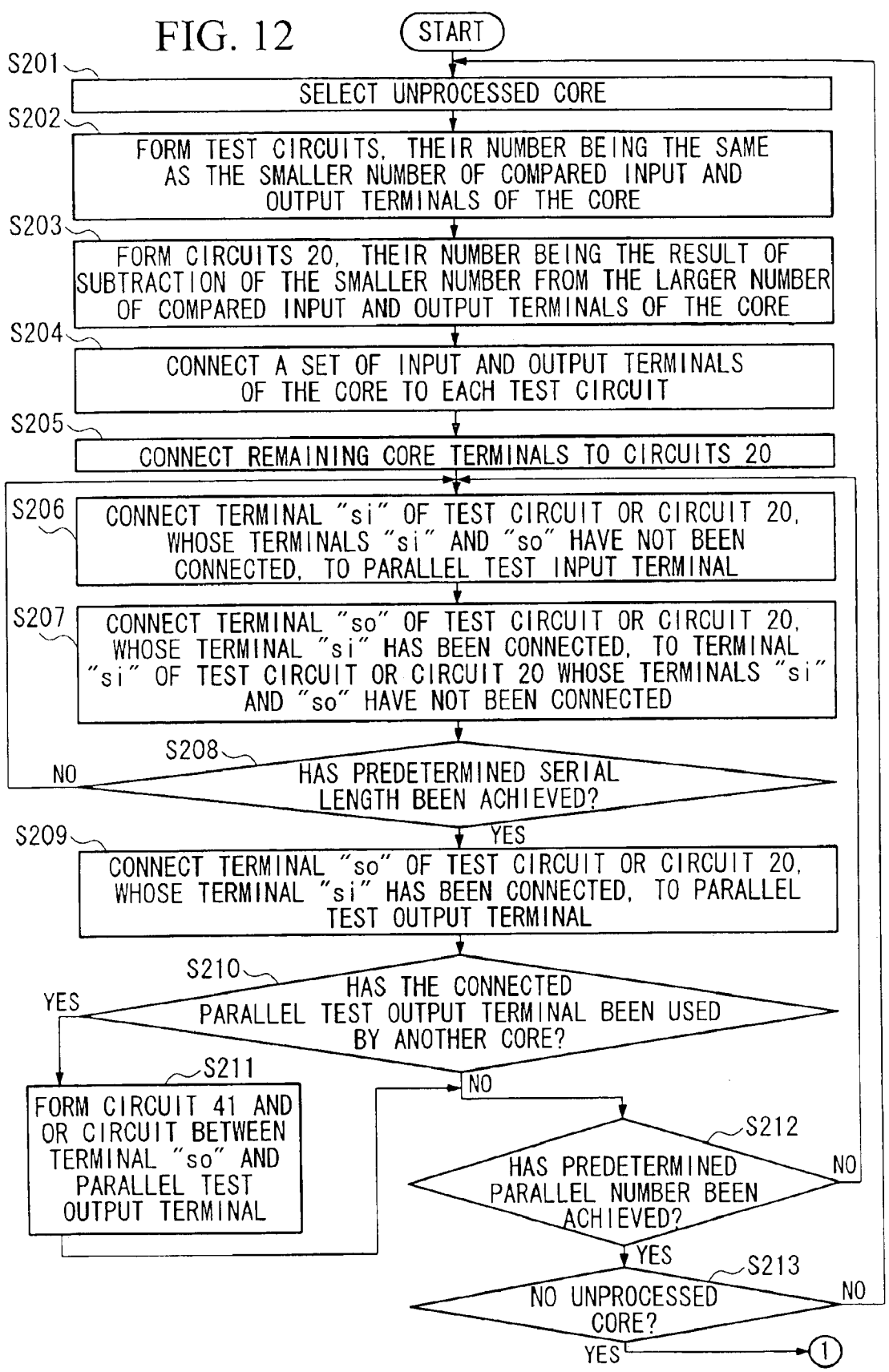
FIG. 12 is a flowchart showing the operation of forming test circuits as an embodiment of the present invention.

Below, the method of forming test circuits will be explained in detail with reference to a flowchart shown in FIGS. 12 and 13. Here, the method of forming the test circuits in FIG. 2 will be explained as an example.

First, an unprocessed core is chosen from cores 1 and 2 (see step S201). Here, core 1 is chosen. Next, the number of input terminals and the number of output terminals are compared, and test circuits 10, their number of them being the same as the smaller number of the compared numbers of terminals, are formed (see step S202). Here, the number of input terminals agrees with the number of output terminals in core 2; thus, two test circuits 11 and 12 are formed.

Next, the above smaller number is subtracted from the larger number of the above compared numbers of terminals, and circuits 20, their number being the same as the result of the subtraction, are formed (see step S203). Here, core 1 has the same number of input terminals and output terminals; thus, no circuit 20 is formed.

Next, a core input and a core output are connected to each test circuit 10 (here, circuits 11 and 12, see step S204). In the following step S205, the remaining core terminals are connected to circuits 20; however, no circuit 20 has been formed in the present case, and thus this step is omitted.

Next, the terminal "si" of a circuit (test circuit or circuit 20), whose terminals "si" and "so" have not yet been connected, is connected to a parallel test input terminal (see step S206). Here, PIN1 and test pattern input terminal "si" of test circuit 11 are connected, so that in the test circuit 11, terminal "si" has been connected while terminal "so" has not yet been connected. This test circuit 11 is then connected to a circuit (test circuit 10 or circuit 20, here, test circuit 12) whose terminals "si" and "so" have not yet been connected (see step S207). The process from steps S206 to S208 are repeated until the chain of circuits reaches the serial length determined for core 1 (see step S208).

Next, the terminal "so" of a circuit (test circuit 10 or circuit 20), whose terminal "si" has been connected but whose terminal "so" has not yet been connected, is connected to parallel test output terminal POT1 (see step S209). Here, this parallel test output terminal is not used by another core (see step S210); thus, the operation proceeds to step S212. In the step S212, the parallel number of core 1 is 1; thus, the operation proceeds to step S213.

Here, unprocessed core 2 remains; thus, the operation proceeds to step S201. The core 2 has 4 input terminals and 3 output terminals; thus, in step S203, a circuit 20 is formed. Next, an input terminal and an output terminal of core 2 are connected to each of test circuits 13 to 15 (see step S204), and circuit 20 is also connected to core 2 (see step S205). Next, in step S206, test circuit 13 and parallel test input terminal PIN1 are connected.

Next, test circuits 13 and 14 are connected (see step S207), so that the serial chain reaches the serial length "2" of core 2 (see step S208); thus, the test pattern output terminal "so" of the test circuit 14 and parallel test output terminal POT1 are connected (see step S209). Here, the parallel test output terminal POT1 has been connected to another circuit (see step S210); thus, circuit 41 and OR circuit 48 are inserted (see step S211 and FIG. 2). Here, the parallel condition has not yet reached the parallel number "2" of core 2 (see step S212); thus, the connection processes from step S206 are repeated.

Figure 13:
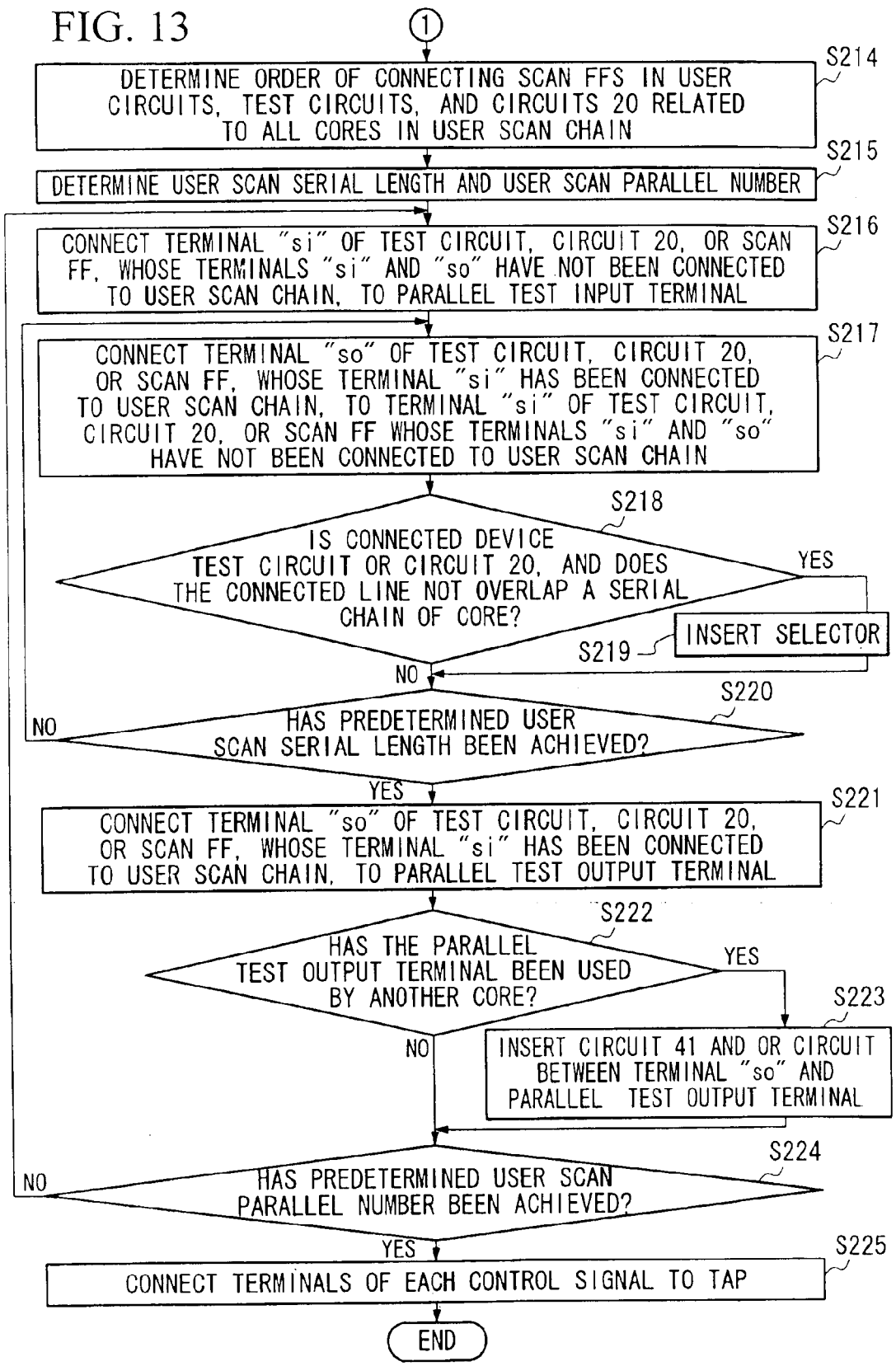
FIG. 13 is a flowchart showing the operation of forming test circuits as an embodiment of the present invention.

When all cores have been processed (see step S213), the processes for connecting the user circuits are executed (refer to FIG. 13). First, the order of connecting the scan FFs 31 to 36 in the user circuits, test circuits 10, and circuits 20 (connected to the cores) in a user scan chain is determined (see step S214). Next, the user scan serial length and user scan parallel number are determined. As explained above, the user scan serial length is 12 and the user scan parallel number is 1 (see step S215).

Next, the terminal "si" of a circuit (one of test circuits 11 to 15, circuit 20, and scan FFs 31 to 36), whose terminals "si" and "so" have not yet been connected to the user scan chain, is connected to a parallel test input terminal (see step S216). Here, the test circuit 11 has already been connected to the parallel test input terminal PIN1; thus, this process is omitted.

Next, the terminal "so" of a circuit (one of test circuits 11 to 15, circuit 20, and scan FFs 31 to 36), whose terminal "si" has been connected to the user scan chain but terminal "so" has not been connected to the user scan chain, is connected to the terminal "si" of a circuit (one of test circuits 11 to 15, circuit 20, and scan FFs 31 to 36), whose terminals "si" and "so" have not yet been connected to the user scan chain (see step S217). Here, the test pattern output terminal "so" of user circuit 12 and the test pattern input terminal "si" of scan FF 31 are connected. Here, the connected device is scan FF 31 (see step S218); thus, the operation proceeds to step S220.

The processes from step S217 to S220 are repeated until the connection arrangement reaches the user scan serial length. Here, when the scan FF 36 and test circuit 13 are connected, selector 51 is inserted between them because the test circuit 13 has been connected to parallel test input terminal PIN1 (see steps S218 and S219).

When the connection arrangement reaches the user scan serial length (see step S220), the terminal "so" of a circuit (one of test circuits 11 to 15, circuit 20, and scan FFs 31 to 36), whose terminal "si" has been connected to the user scan chain and terminal "so" has not yet been connected to the user scan chain, is connected to a parallel test output terminal (see step S221). Here, the test pattern output terminal "so" of circuit 20 is connected to parallel test output terminal POT2.

If the parallel test output terminal has already been used by another core (see step S222), circuit 41 and an OR circuit are inserted (see step S223). In the present case, the relevant parallel test output terminal has not been used by another core; thus, this process in step S223 is omitted.

The processes from step S216 to step S224 are repeated until the connection arrangement reaches the user scan parallel number (see step S224). Finally, the terminal of each control signal is connected to TAP 60 (see step S225).

The execution management can be performed by storing a program for executing the above-explained test circuit forming method in a computer readable storage medium, and making a computer system load and execute the program. The computer system includes hardware resources such as an OS and peripheral devices, and each section of the test circuit forming system (according to the present invention) for implementing the test circuit forming method is also provided on hardware resources of the computer system, such as the CPU and memories. If the computer system employs a WWW (world wide web) system, the computer system can provide a homepage viewable environment.

The above computer readable storage medium is, for example, a portable medium such as a floppy disk, magneto optical disk, ROM, or CD-ROM, or a memory device such as a hard disk built in a computer system. The computer readable storage medium also includes a memory for temporarily storing the program, such as a RAM which is a volatile storage medium in a computer system which functions as a server or client and receives the program via a network (e.g., the Internet) or a communication line (e.g., a telephone line). The above program, stored in a memory device of a computer system, may be transmitted by using transmitted waves passing through a transmission medium to another computer system. The transmission medium for transmitting the program has a function of transmitting data, and is, for example, a (communication) network such as the Internet or a communication line such as a telephone line.

In addition, the program may be for executing a part of the above-explained functions, or these functions may be executed by a combination program of a "differential" program stored in a computer readable storage medium and an existing program which has already been stored in the computer system.

The embodiments of the present invention have been explained with reference to the drawings. However, possible embodiments are not limited to those, and any modifications or variations are possible within the scope and spirit of the claimed invention.

What is claimed is:

1. A test circuit, provided between first and second target circuits, for testing the target circuits, comprising:
    a first selecting section for selecting and outputting one of three input signals, namely: (1) a first output signal output from the first target circuit, (2) a second output signal output from the second target circuit, and (3) a test signal indicating a test pattern input via a test pattern input terminal, said selection being made according to first and second test mode signals supplied to said first selecting section as additional inputs used for selection, said first and second test mode signals supplied from an external device;

a temporary data storage section for temporarily storing the signal selected by the first selecting section as a data signal;

a second selecting section for selecting, as a first selection signal one of either the temporarily stored data signal stored in said temporary data storage section or the second output signal from the second target circuit according to the second test mode signal fed to said second selecting section as a selection input, and providing the first selected signal to the first target circuit; and a third selecting section for selecting, as a second selecting signal, one of the temporarily stored data signal or the first output signal from the first target circuit according to a third test mode signal supplied from said external device, and providing the second selected signal to the second target circuit, and wherein:

the temporarily stored data signal is also output as a test result via a test pattern output terminal.

2. An integrated circuit device including a test circuit as claimed in claim 1.

3. A test circuit as claimed in claim 1, wherein the first, second, and third selecting sections are multiplexers.

4. An integrated circuit device including a target circuit to be tested, and a test circuit as recited in claim 1 comprising:

a plurality of test circuits, where the number of the test circuits agrees with the number of pairs of input and output terminals of the first target circuit, wherein:

each test circuit is connected to a pair of input and output terminals of the first target circuit;

an external terminal of the integrated circuit device is connected to the test pattern input terminal of one of the test circuits;

a serial chain of a predetermined number of the test circuits is formed by connecting an external terminal of the integrated circuit device and the test pattern input terminal of one of the test circuits, and repeating an operation of connecting the test pattern output terminal of the connected test circuit and the test pattern input terminal of another test circuit; and the test pattern output terminal of the last connected test circuit is connected to another external terminal of the integrated circuit device for outputting a test result.

5. A test method of testing first and second target circuits, comprising the steps of:

selecting and outputting one of three input signals, namely: (1) a first output signal output from the first target circuit, (2) a second output signal output from the second target circuit, and (3) a test signal indicating a test pattern input via a test pattern input terminal, said selection being made according to first and second test mode signals supplied as additional inputs used in selection, said first and second test mode signals supplied from an external device;

temporarily storing the selected signal as a data signal;

selecting as a first selected signal, one of the temporarily stored data signal or the second output signal from the second target circuit according to the second test mode signal, and providing the first selected signal to the first target circuit;

selecting as the second selected signal, one of the temporarily stored data signal or the first output signal from the first target circuit according to a third test mode signal supplied from said external device, and providing the second selected signal to the second target circuit; and outputting the temporarily stored data signal as a test result via a test pattern output terminal.

* * * * *